(12) United States Patent
Kim et al.

(10) Patent No.: US 12,362,287 B2
(45) Date of Patent: Jul. 15, 2025

(54) SEMICONDUCTOR DEVICE AND METHOD OF MAKING DOUBLE SHIELDING LAYERS OVER THE SEMICONDUCTOR DEVICE

(71) Applicant: STATS ChipPAC Pte. Ltd., Singapore (SG)

(72) Inventors: ChangOh Kim, Incheon (KR); JinHee Jung, Incheon (KR); YoungCheol Kim, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 383 days.

(21) Appl. No.: 17/808,613

(22) Filed: Jun. 24, 2022

(65) Prior Publication Data

US 2023/0420382 A1    Dec. 28, 2023

(51) Int. Cl.
| | |
|---|---|
| *H01L 23/552* | (2006.01) |
| *H01L 21/56* | (2006.01) |
| *H01L 23/00* | (2006.01) |
| *H01L 23/498* | (2006.01) |
| *H01L 25/16* | (2023.01) |

(52) U.S. Cl.
CPC .......... *H01L 23/552* (2013.01); *H01L 24/96* (2013.01); *H01L 24/97* (2013.01); *H01L 25/165* (2013.01); *H01L 21/561* (2013.01); *H01L 21/565* (2013.01); *H01L 23/49816* (2013.01); *H01L 23/49833* (2013.01); *H01L 24/16* (2013.01); *H01L 2224/16235* (2013.01); *H01L 2924/3025* (2013.01)

(58) Field of Classification Search
CPC ....... H01L 23/552; H01L 24/96; H01L 24/97; H01L 25/165; H01L 21/561; H01L 21/565; H01L 23/49816; H01L 23/49833; H01L 24/16; H01L 2224/16235; H01L 2924/3025; H01L 25/16; H01L 21/50; H01L 23/60
USPC .................................................. 257/30; 438/2
See application file for complete search history.

(56) References Cited

U.S. PATENT DOCUMENTS

| | | | |
|---|---|---|---|
| 10,593,629 B2 | 3/2020 | Chiang et al. | |
| 2009/0183766 A1* | 7/2009 | Takahashi | H10F 77/331 257/431 |
| 2015/0016066 A1* | 1/2015 | Shimamura | H05K 1/0216 29/841 |
| 2016/0268216 A1* | 9/2016 | Kim | H01L 23/552 |
| 2017/0294387 A1* | 10/2017 | Kawabata | H01L 21/485 |
| 2018/0049311 A1* | 2/2018 | Hoang | H01L 25/0652 |

(Continued)

*Primary Examiner* — Didarul A Mazumder
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A first electrical component and second electrical component are disposed over the substrate. A conductive pillar is formed over the substrate between the first electrical component and second electrical component. A first shielding layer is formed over the first electrical component and conductive pillar by jet printing conductive material. A second shielding layer is formed over the first electrical component and second electrical component by sputtering, spraying, or plating conductive material. An insulating layer is optionally formed between the first shielding layer and second shielding layer by jet printing insulating material over the first shielding layer.

17 Claims, 8 Drawing Sheets

(56) References Cited

U.S. PATENT DOCUMENTS

| | | | |
|---|---|---|---|
| 2019/0103365 A1* | 4/2019 | Singh | H01L 23/552 |
| 2020/0144236 A1* | 5/2020 | Jang | H01L 23/3128 |
| 2020/0286835 A1* | 9/2020 | Yang | H01L 21/565 |
| 2021/0151386 A1* | 5/2021 | Yang | H01L 21/6835 |
| 2021/0217704 A1* | 7/2021 | Otsubo | H01L 23/49822 |
| 2021/0407927 A1 | 12/2021 | Salmon et al. | |
| 2022/0251398 A1* | 8/2022 | Nakazono | C09D 163/00 |

\* cited by examiner

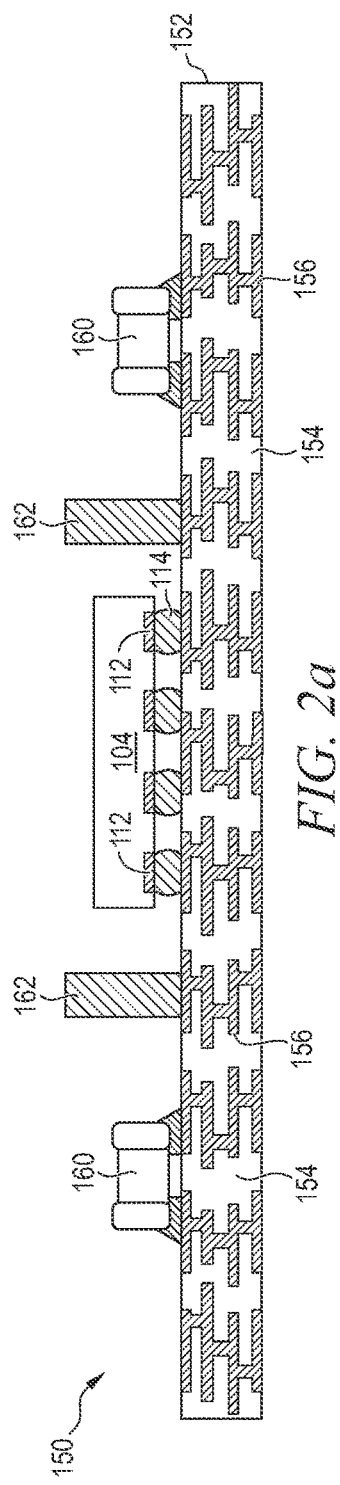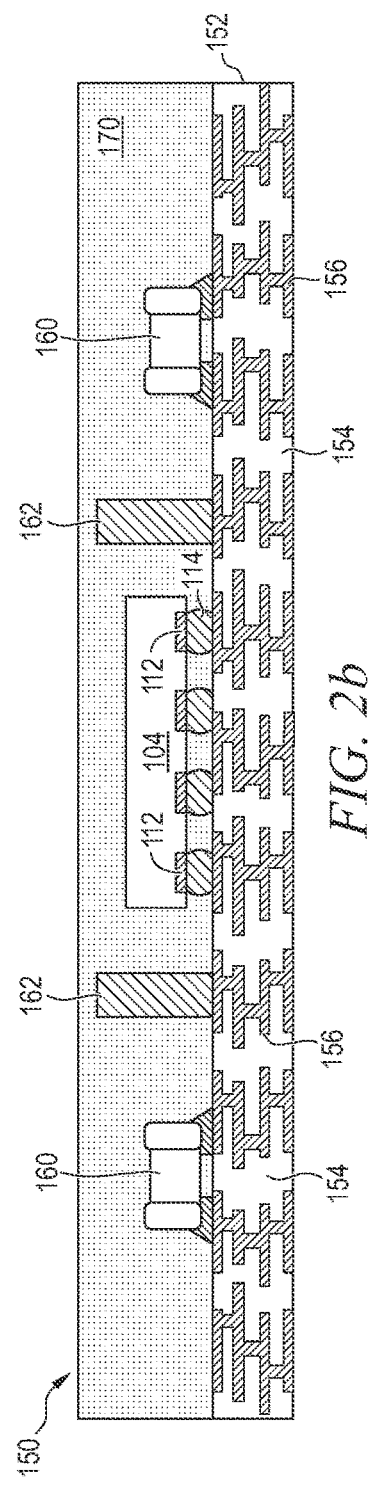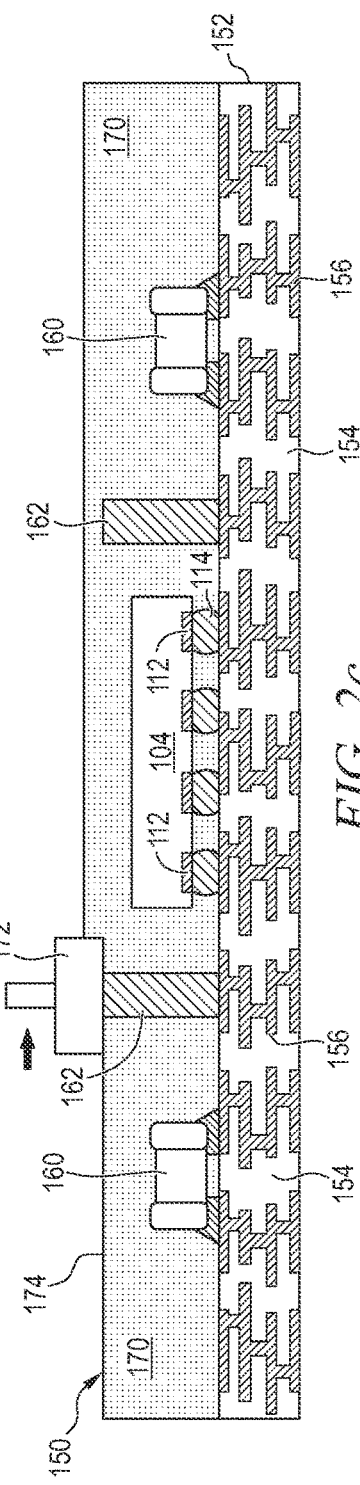

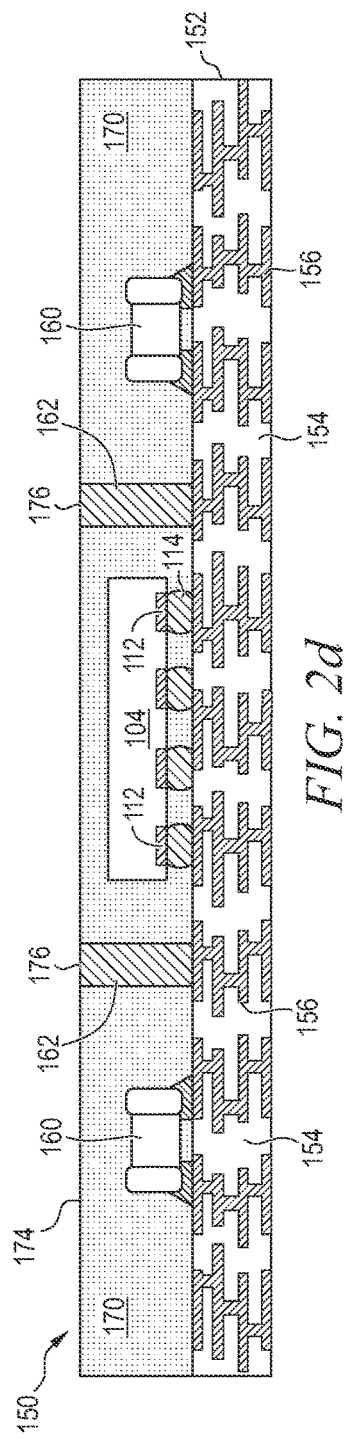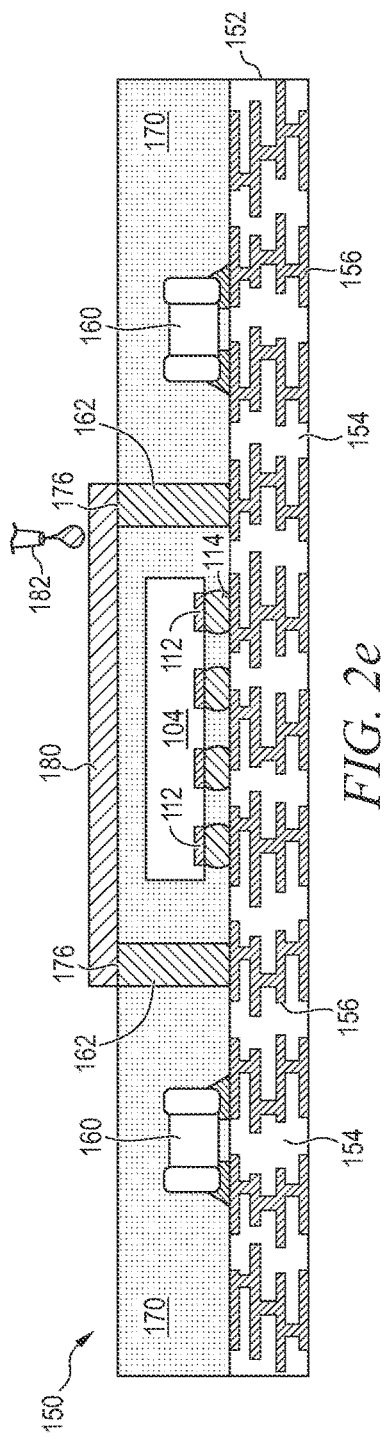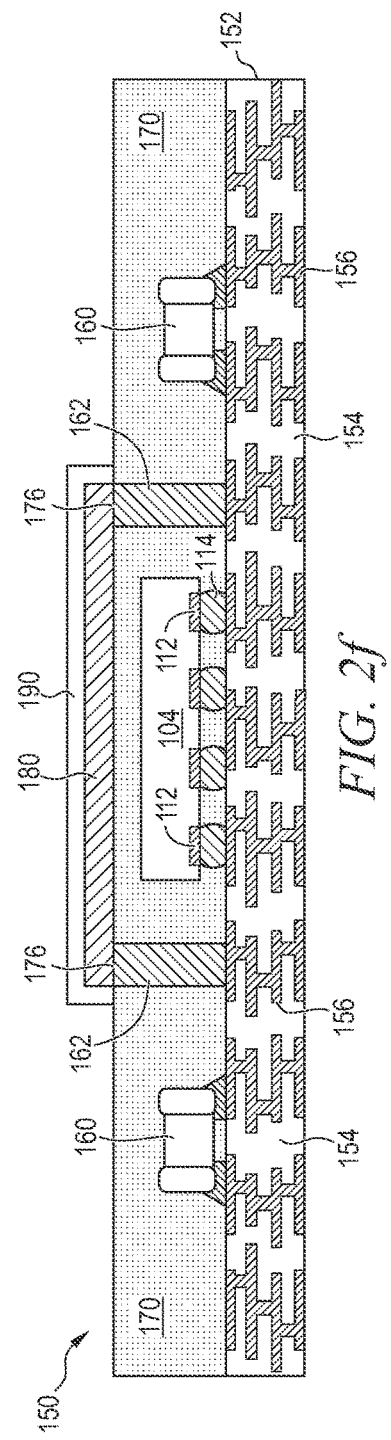

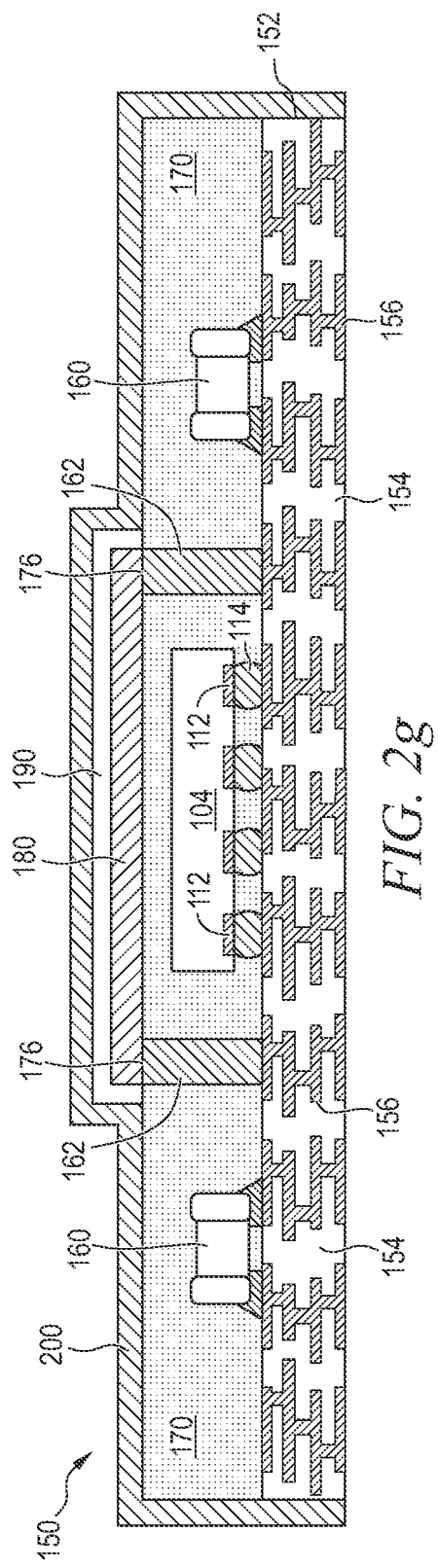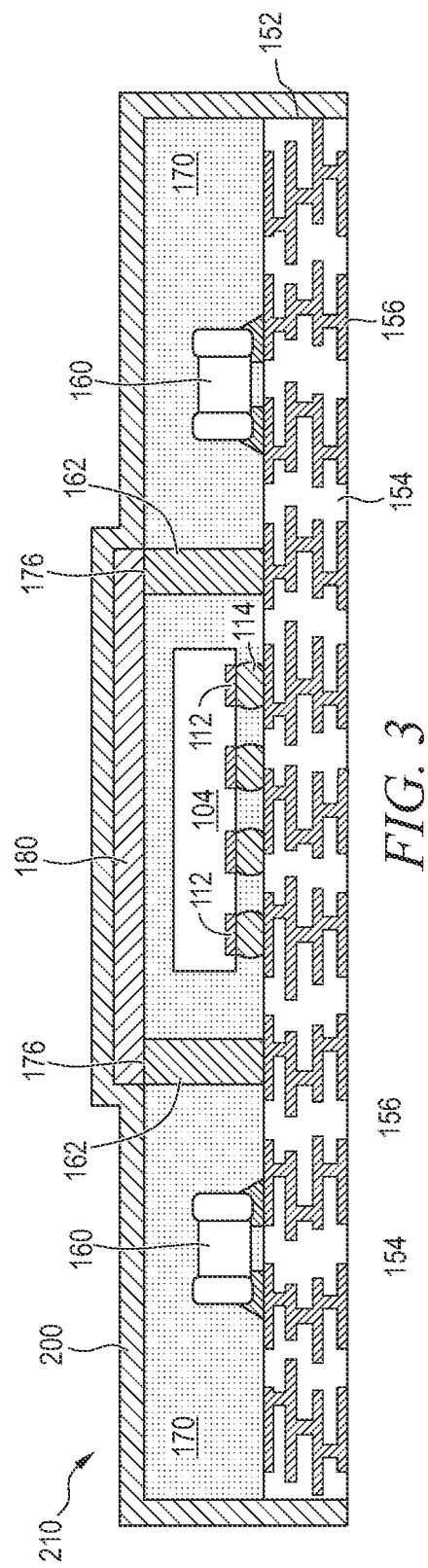

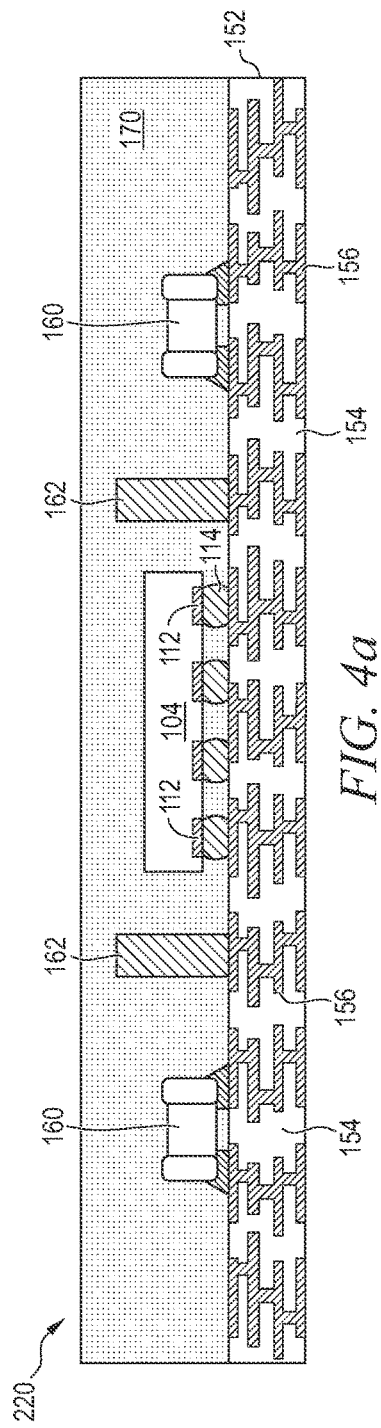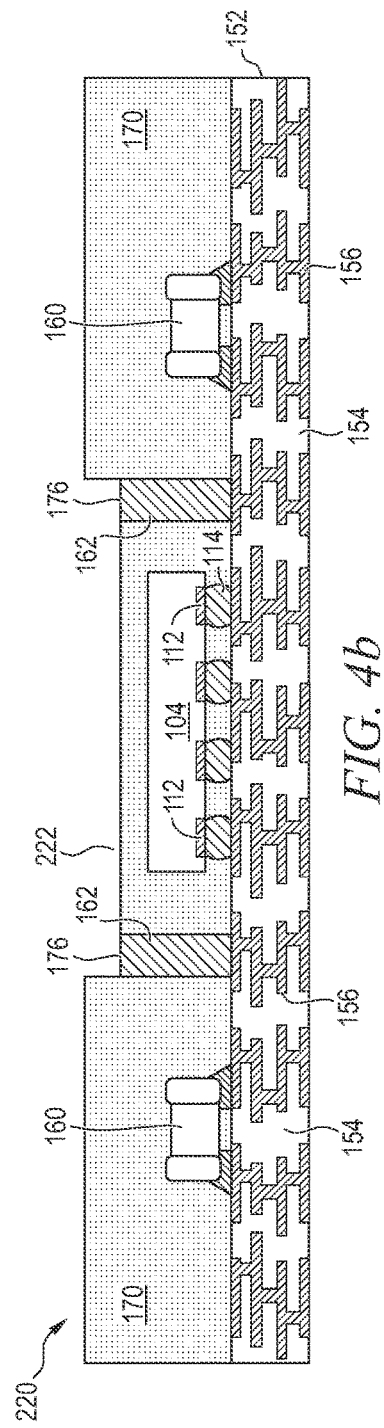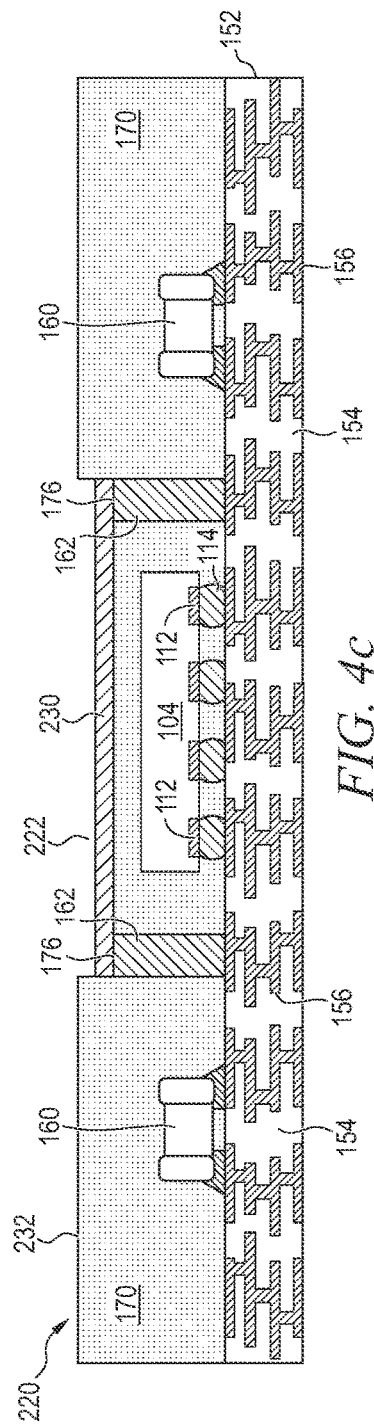

SEMICONDUCTOR DEVICE AND METHOD OF MAKING DOUBLE SHIELDING LAYERS OVER THE SEMICONDUCTOR DEVICE

FIELD OF THE INVENTION

The present invention relates in general to semiconductor manufacturing and, more particularly, to a semiconductor device and method of double shielding for semiconductor packages.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. Shielding layers absorb EMI before the signals reach semiconductor die and discrete components within the package, which might otherwise cause malfunction of the device. Shielding layers are also formed over packages with components that are expected to generate EMI to protect nearby devices.

One problem with prior art methods of semiconductor package shielding is that the conformal shielding layers do not prevent EMI loop currents from flowing through the shielding layer and inducing electric and magnetic fields in sensitive neighboring components of the same semiconductor package. Selective shielding over only the most sensitive die or component effectively blocks noise sources and enhances the electrical performance of just the selectively shielded components.

However, forming both a selective shield over sensitive components and also a conformal shield over the entire semiconductor package is a complicated and high-cost process. Therefore, a need exists for an improved semiconductor device and method of double shielding.

BRIEF DESCRIPTION OF THE DRAWINGS

FIGS. 2a-2g illustrate forming a double shielding layer with selective shielding;

FIG. 3 illustrates an embodiment of double shielding without isolation between the shielding layers;

FIGS. 4a-4e illustrate forming the selective EMI shielding in a recess; and

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other suitable interconnect structures. An encapsulant or other molding compound is deposited over the package to provide physical support and electrical isolation. The finished package is then inserted into an electrical system and the functionality of the semiconductor device is made available to the other system components.

Figure 1A:
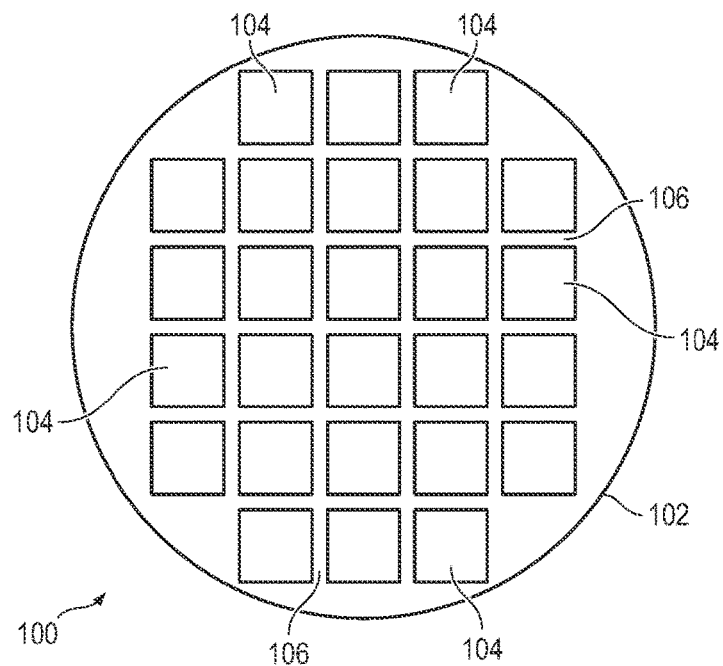
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
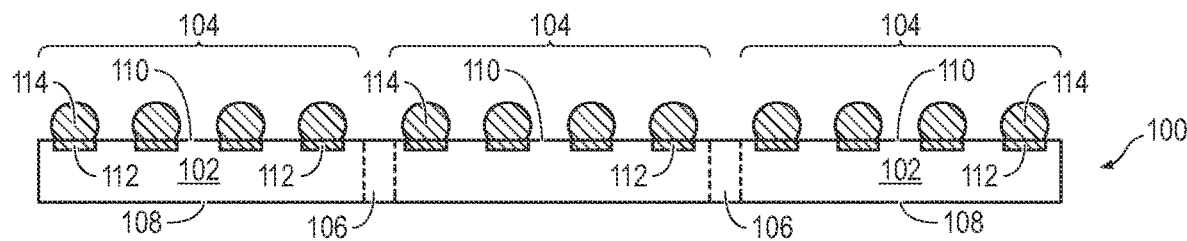

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. Conductive bumps 114 are optionally formed over an under-bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bumps, micro bumps, or other electrical interconnects.

Figure 1C:
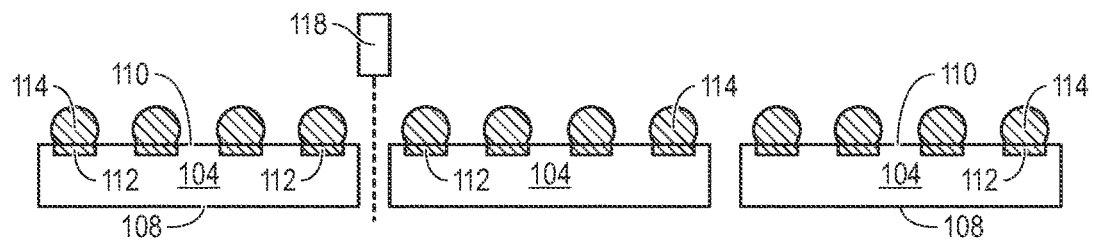

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post-singulation.

FIGS. 2a-2g illustrate forming a semiconductor package 150 with semiconductor die 104. In some embodiments, package 150 is a system-in-package (SiP) module. FIG. 2a shows a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Semiconductor package 150 in FIG. 2a has had semiconductor die 104, discrete components 160, and conductive pillars 162 mounted thereon, as well as any other discrete active or passive components, semiconductor die, or other components desired for the intended functionality of the packages. Solder bumps 114 are reflowed between conductive layers 156 and semiconductor die 104 to mechanically and electrically connect the die to substrate 152. Any type and number of components can be mounted onto either the top surface of substrate 152 as illustrated in FIG. 2a, the bottom surface, or both, and also embedded within the substrate in any suitable order and configuration.

Discrete components 160 as illustrated are merely representative. Any type and number and components can be used. Conductive pillars 162 provide lateral blocking of electromagnetic interference (EMI) between semiconductor die 104 and discrete components 160. Conductive pillars 162 are typically, but not necessarily, coupled to ground through substrate 152 to aid in EMI reduction. Conductive pillars 162 can be a plurality of discrete pillars distributed around semiconductor die 104, or a single piece of material extending continuously all the way around the semiconductor die. Conductive pillars 162 are formed from aluminum, copper, steel, titanium, gold, other metals, or a combination or alloy thereof. Conductive pillars 162 are formed separately and then picked and placed onto substrate 152. In other embodiments, conductive pillars 162 are formed directly on substrate 152 using a photoresist layer as a mask that is removed.

After mounting of semiconductor die 104, discrete components 160, conductive pillars 162, and any other desired electrical components onto substrate 152, the components are encapsulated by encapsulant or molding compound 170. Encapsulant 170 is deposited over substrate 152, semiconductor die 104, discrete components 160, and conductive pillars 162 using paste printing, compressive molding, transfer molding, liquid encapsulant molding, vacuum lamination, spin coating, or another suitable applicator. Encapsulant 170 can be polymer composite material, such as epoxy resin, epoxy acrylate, or polymer with or without a filler. Encapsulant 170 is non-conductive, provides structural support, and environmentally protects the semiconductor device from external elements and contaminants. Encapsulant 170 completely covers top and side surfaces of semiconductor die 104, discrete components 160, and conductive pillars 162. Encapsulant 170 fills any gaps between substrate 152 and semiconductor die 104 or discrete components 160 unless a separate underfill is used.

In FIG. 2c, a portion of encapsulant 170 is removed by backgrinding with a mechanical grinder 172. In other embodiments, chemical etching, chemical-mechanical planarization (CMP), or another suitable planarization method is used. The grinding process exposes conductive pillars 162 and leaves a top surface 174 of encapsulant 170 coplanar to top surfaces 176 of the conductive pillars as shown in FIG. 2d. In other embodiments, encapsulant 170 is deposited prior to the formation of conductive pillars 162. In that case, conductive pillars 162 are formed by drilling through encapsulant 170 to substrate 152 and filling the resulting vias or holes with conductive material. Jet printing is used to form conductive pillars 162 in encapsulant 170 in one embodiment.

In FIG. 2e, a selective shielding layer 180 is formed over semiconductor die 104 and conductive pillars 162 by jet printing of metal ink. The jet printing is represented by a nozzle 182 in FIG. 2e. Nozzle 182 can be used to form selective shielding layer 180 in any arbitrary pattern. The conductive ink printing can be electrohydrodynamic (EHD) jet printing, where an electric field between the nozzle and a conductive plate used as a carrier for package 150 during manufacturing is used to guide the conductive ink being printed. In some embodiments, laser transfer printing is used to form selective shielding layer 180. In laser transfer printing, a metal-coated transparent film is disposed over semiconductor package 150 with the metal oriented toward the package. Metal is transferred from the film to semiconductor package 150 by focusing a laser onto the film where printing of selective shielding layer 180 is desired. Aerosol jet printing or another type of conductive material printing is used in other embodiments. The printed material is copper, steel, aluminum, gold, titanium, a combination thereof, or any other suitable material.

Selective shielding layer 180 is formed into a sheet of material extending to each conductive pillar 162 and filling the area of surface 174 between the conductive pillars. Selective shielding layer 180 is formed directly on the top surfaces 176 of conductive pillars 162. Selective shielding layer 180 in combination with conductive pillars 162 form an EMI shield specifically for semiconductor die 104 or one or more other components particularly sensitive to EMI. Selective shielding layer 180 can completely fill the footprint area between conductive pillars 162, or can be formed with holes, stripes, or other discontinuities.

Selective shielding layer 180 is only formed over the area between conductive pillars 162 where the sensitive components are located and is not formed outside of the area in question. The purpose of having a shielding layer specific to semiconductor die 104 is to reduce EMI loop currents being induced in the selective shielding layer 180 from elsewhere in package 150 and causing interference in the semiconductor die, or vice versa. Selective shielding layer 180 can extend outside of the area between conductive pillars 162 for a variety of reasons but extending the selective shielding layer 180 over other components can reduce the efficacy of the selective shielding layer by increasing EMI loop currents between components within and outside of the selective shielding.

In FIG. 2f, an insulating layer 190 is formed over selective shielding layer 180. Insulating layer 190 is jet printed with nozzle 182 or second nozzle to separate printing of conductive and insulating material. Insulating layer 190 is printed by laser transfer printing or another type of insulating layer printing in other embodiments. Insulating layer 190 contains one or more layers of silicon dioxide (SiO2), silicon nitride (Si3N4), silicon oxynitride (SiON), tantalum pentoxide (Ta2O5), aluminum oxide (Al2O3), solder resist, polyimide (PI), benzocyclobutene (BCB), polybenzoxazoles (PBO), or other material having similar insulating and structural properties. Insulating layer 190 completely covers selective shielding layer 180 and extends down to physically contact encapsulant 170 around the selective shielding layer.

Selective shielding layer 180 and insulating layer 190 are typically formed at the strip level, meaning that packages 150 remain as a strip of packages formed together on substrate 152 as a large unsingulated strip, or as singulated packages on a common strip carrier. Jet printing reduces the complexity and cost of forming selective shielding layer 180 and insulating layer 190 over just the area between conductive pillars 162 relative to prior art methods that cover an entire panel of units with material and then pattern the layers using photolithography or another suitable mechanism.

If semiconductor package 150 is formed as a strip of units, the strip is singulated prior to forming a conformal shielding layer 200 over the entire package in FIG. 2g. Conformal shielding layer 200 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable material. Conformal shielding layer 200 completely covers exposed surfaces of encapsulant 170, substrate 152, and insulating layer 190. Conductive layer 156 can be exposed at sides of substrate 152 to connect shielding layer 200 to ground through the substrate.

Insulating layer 190 physically and electrically isolates selective shielding layer 180 from conformal shielding layer 200. Keeping selective shielding layer 180 physically isolated from conformal shielding 200 reduces the effect that EMI loop currents in the conformal shielding 200, created by discrete components 160 or other components outside of the selective shielding, have on semiconductor die 104 due to the extra selective shielding specific to the semiconductor die. Conversely, EMI loop currents generated by semiconductor die 104 in selective shield layer 180 have a reduced effect on discrete components 160 by being directly shunted to ground and not conformal shielding layer 200. Jet printing selective shielding layer 180 and insulating layer 190 reduces the cost and complexity of manufacturing.

FIG. 3 shows another embodiment as semiconductor package 210. Semiconductor package 210 is formed in substantially the same method as semiconductor package 150 except that insulating layer 190 is not formed between selective shielding layer 180 and conformal shielding layer 200. Without insulating layer 190, conformal shielding layer 200 is formed directly on selective shielding layer 180. Without physical isolation between the shielding layers, EMI loop currents flow between both. However, the extra path to ground of conductive pillars 162 still helps shunt EMI loop currents to ground to a greater extent than having only conformal shielding layer 200. The extra thickness of selective shielding layer 180 in combination with conformal shielding layer 200 also helps shield semiconductor die 104 in particular even without the physical isolation of insulating layer 190.

Figure 4D:
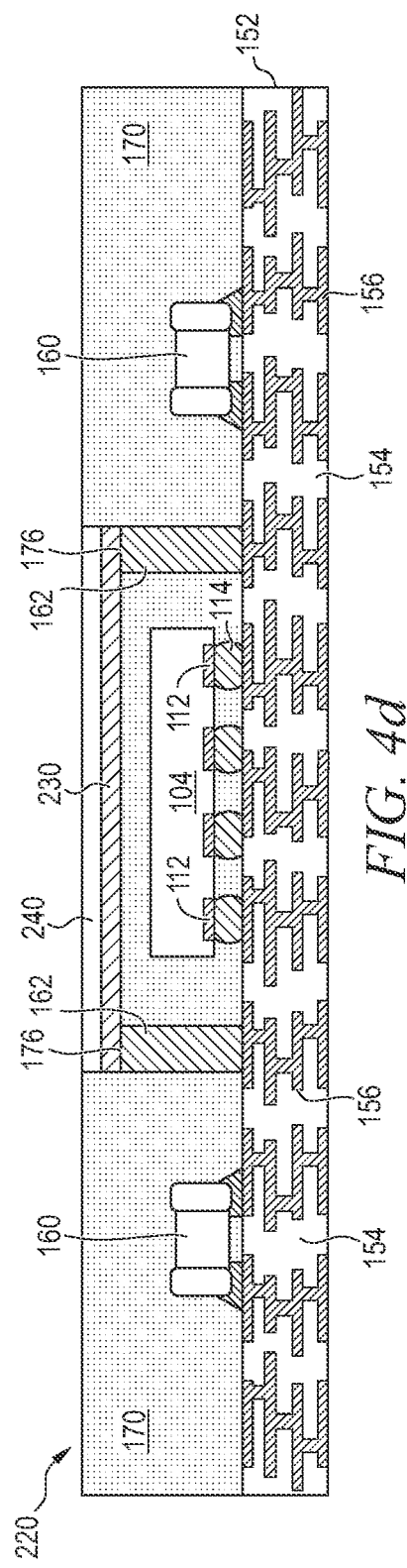

FIGS. 4a-4e illustrate forming a selective shielding layer recessed within semiconductor package 220. In FIG. 4a, encapsulant 170 is deposited over conductive pillars 162 as in FIG. 2b. A recess 222 is formed into encapsulant 170 in FIG. 4b by laser ablation, chemical etching, or another suitable process. Recess 222 is formed down to conductive pillars 162 so that the top surface 176 of each conductive pillar is exposed within the recess. Recess 222 follows the same footprint as discussed above for selective shielding layer 180.

In FIG. 4c, selective shielding layer 230 is formed within recess 222. Selective shielding layer 230 is formed by jet printing, by being sputtered through a photoresist mask, or by another suitable process. Selective shielding layer 230 can be formed using any of the methods and materials discussed above for selective shielding layer 180. Selective shielding layer 230 fills the footprint of recess 222 in one embodiment, and physically contacts the top surface 176 of each conductive pillar 162. In embodiments where selective shielding layer 230 does not completely fill the footprint area between conductive pillars 162, recess 222 can still completely fill the footprint area with selective shielding layer 230 formed with stripes, holes, or other discontinuities as desired. Alternatively, recess 222 can be formed with the desired final shape for selective shielding layer 230 and then have its footprint completely filled by jet printing conductive material. Selective shielding layer 230 is recessed below top surface 232 of encapsulant 170.

In FIG. 4d, the remaining volume of recess 222 is filled with an insulating layer 240. Insulating layer 240 is formed in a similar manner to, and of similar materials as, insulating layer 190 above. Insulating layer 240 can be jet printed to fill recess 222 with a surface coplanar to top surface 232 of encapsulant 170. In some embodiments, recess 222 is overfilled by insulating layer 240 and then package 222 is backgrinded to make encapsulant 170 and insulating layer 240 coplanar. In other embodiments, recess 222 is not completely filled.

Figure 4E:
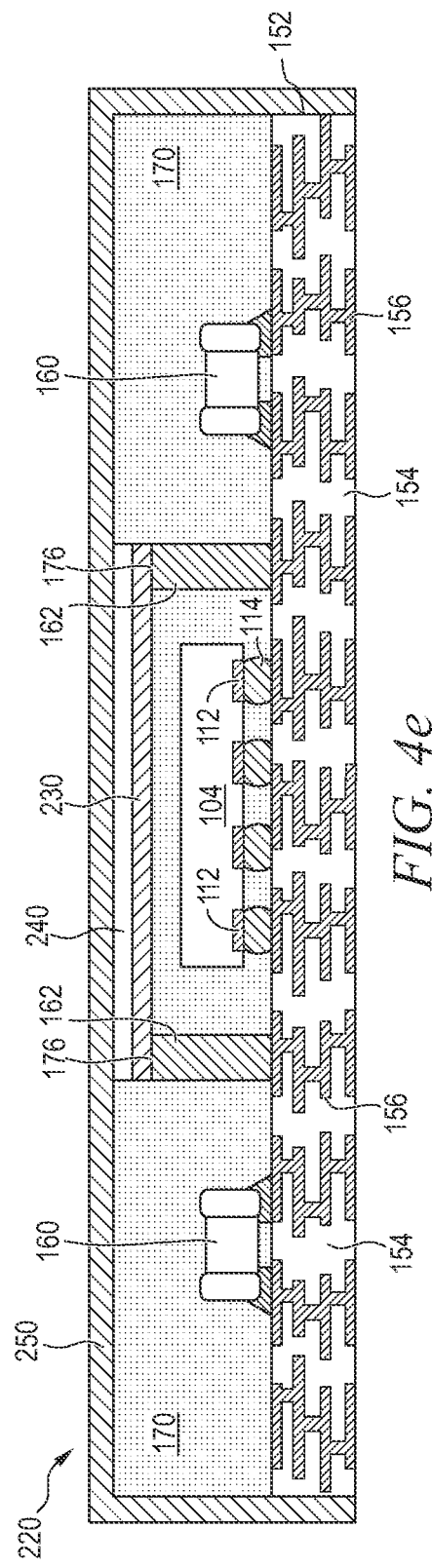

In FIG. 4e, conformal shielding layer 250 is formed over package 220, completely covering top and side surfaces of the package. In embodiments where package 220 is formed as a panel of devices, the panel is singulated to separate the packages from each other and expose the side surfaces of the packages for shielding. Shielding layer 250 is formed in a similar manner to, and of similar materials as, conformal shielding layer 200 above. Package 220 provides a selective shielding layer 230 over just semiconductor die 104 or other sensitive components, as well as a conformal shielding layer 250 over the entire package. Selective shielding layer 230 reduces the effects of EMI loop currents between different areas of package 220. Selective shielding layer 230 is recessed within encapsulant 170 so that the top surface of package 220 is planar across the entire footprint of the package. In another embodiment, insulating layer 240 is not used and conformal shielding layer 250 is formed directly on selective shielding layer 230, similar to the embodiment of FIG. 3 but with the selective shielding layer recessed. Selective shielding layer 230 can be formed with a surface coplanar to encapsulant 170 if desired to keep the top surface of package 220 planar.

Figure 5A:
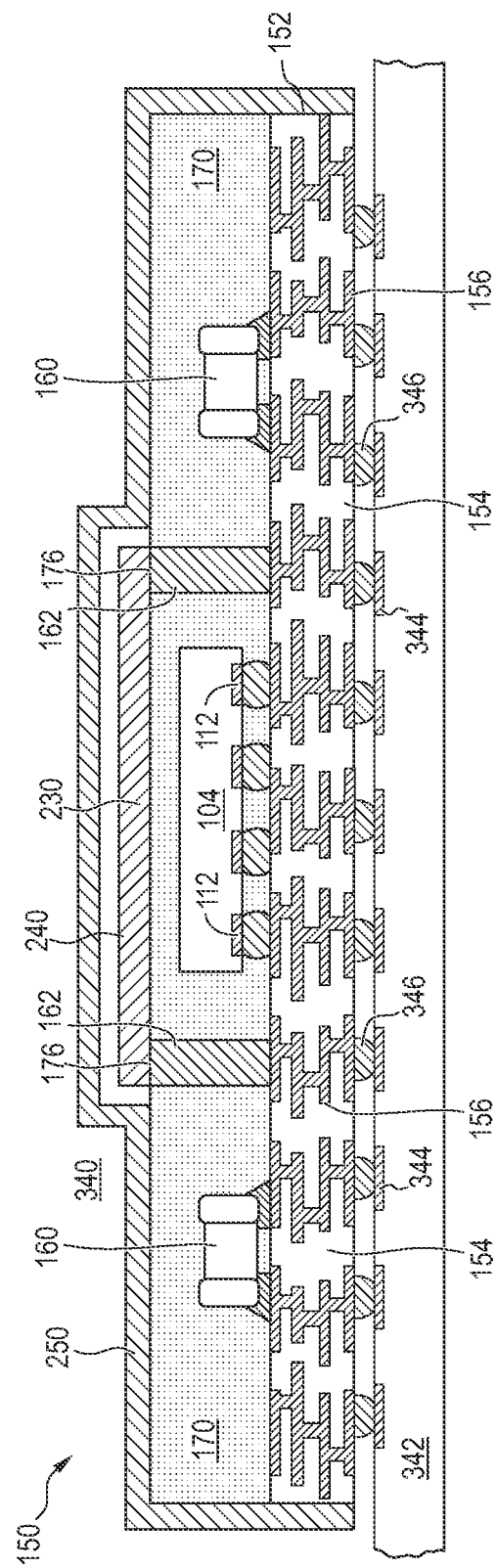
FIGS. 5a and 5b illustrate integrating the double-shielded semiconductor packages into an electronic device.
Figure 5B:
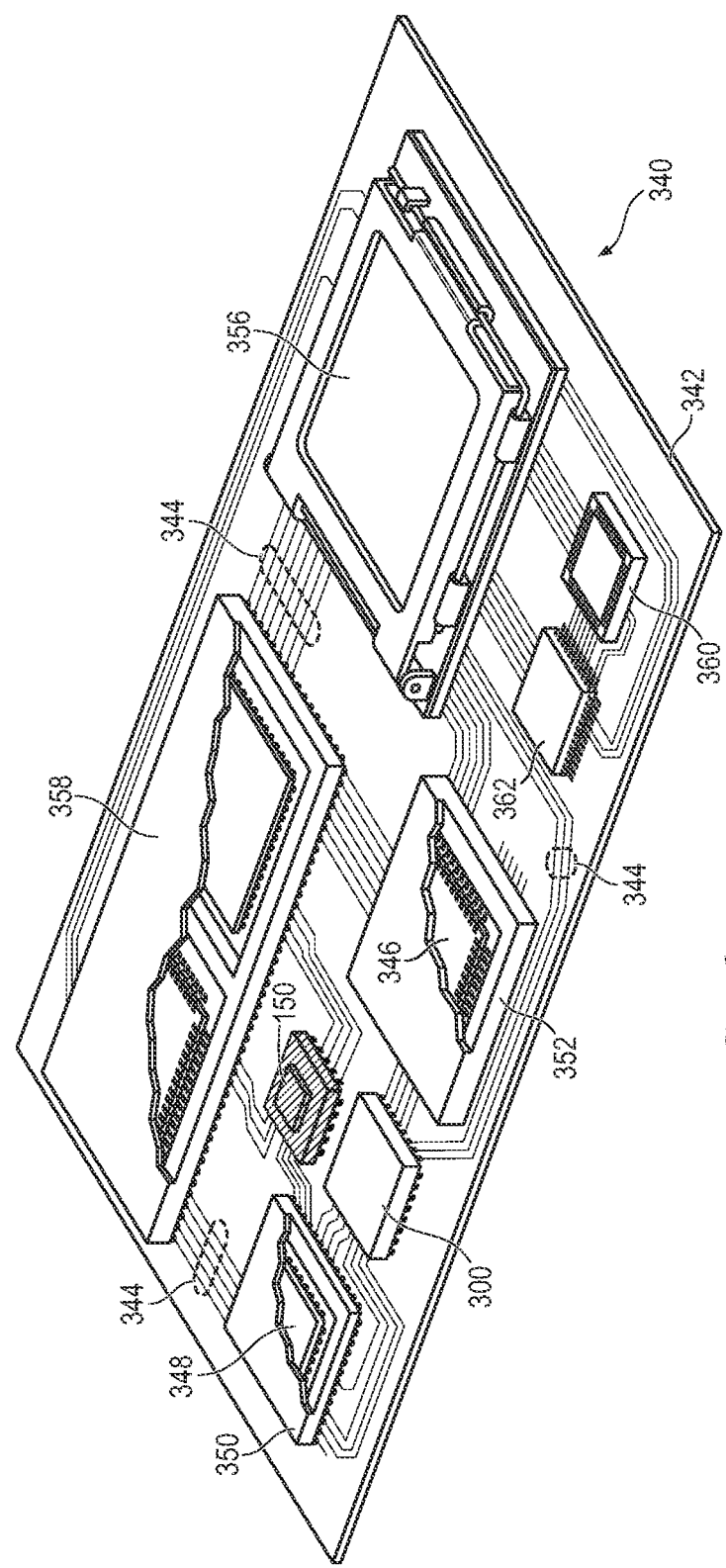

FIGS. 5a and 5b illustrate integrating the above-described semiconductor packages, e.g., semiconductor package 150, into a larger electronic device 340. FIG. 5a illustrates a partial cross-section of semiconductor package 150 mounted onto a printed circuit board (PCB) or other substrate 342 as part of electronic device 340. Bumps 346 are formed similar to the description of bumps 114 above at any desired stage of manufacture and are reflowed onto conductive layer 344 of PCB 342 to physically attach and electrically connect semiconductor package 150 to the PCB. In other embodiments, thermocompression or other suitable attachment and connection methods are used. In some embodiments, an adhesive or underfill layer is used between semiconductor package 150 and PCB 342. Semiconductor die 104 is electrically coupled to conductive layer 344 through substrate 152.

FIG. 5b illustrates electronic device 340 including PCB 342 with a plurality of semiconductor packages mounted on a surface of the PCB, including semiconductor package 150. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 5b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 342 along with semiconductor package 150. Conductive traces 344 electrically couple the various packages and components disposed on PCB 342 to semiconductor package 150, giving use of the components within semiconductor package 150 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    disposing a first electrical component and a second electrical component over the substrate;
    disposing a conductive pillar over the substrate between the first electrical component and the second electrical component;
    depositing an encapsulant over the first electrical component, second electrical component, and conductive pillar after disposing the conductive pillar over the substrate;
    forming a recess in the encapsulant over the conductive pillar after depositing the encapsulant, wherein a top surface of the conductive pillar is exposed within the recess;
    forming a first shielding layer over the encapsulant, the first electrical component, and the conductive pillar by jet printing conductive material, wherein the first shielding layer is completely contained within the recess;
    forming an insulating layer over the first shielding layer, wherein the insulating layer is completely contained within the recess with a top surface of the insulating layer coplanar to a top surface of the encapsulant; and
    forming a second shielding layer over the insulating layer by sputtering, spraying, or plating conductive material, wherein the insulating layer physically and electrically isolates the second shielding layer from the first shielding layer.

2. The method of claim 1, further including selectively forming the first shielding layer over the encapsulant.

3. The method of claim 1, further including forming the insulating layer by jet printing.

4. The method of claim 1, further including singulating the substrate after forming the first shielding layer and before forming the second shielding layer.

5. A method of making a semiconductor device, comprising:
    providing a substrate;
    disposing a first electrical component and a second electrical component over the substrate;
    disposing a conductive pillar over the substrate between the first electrical component and the second electrical component;
    depositing an encapsulant over the first electrical component, second electrical component, and conductive pillar;
    forming a recess in the encapsulant over the conductive pillar, wherein a top surface of the conductive pillar is exposed within the recess;
    forming a first shielding layer over the encapsulant, the first electrical component, and the conductive pillar, wherein the first shielding layer is completely contained within the recess;
    forming an insulating layer over the first shielding layer and conductive pillar, wherein the insulating layer is completely contained within the recess with a top surface of the insulating layer coplanar to a top surface of the encapsulant; and
    forming a second shielding layer over insulating layer, the first electrical component, and the second electrical component.

6. The method of claim 5, further including selectively forming the first shielding layer over the encapsulant.

7. The method of claim 5, further including forming the first shielding layer and the insulating layer by jet printing.

8. The method of claim 7, further including forming the second shielding layer by sputtering, spraying, or plating.

9. The method of claim 8, further including singulating the substrate after forming the first shielding layer and before forming the second shielding layer.

10. A method of making a semiconductor device, comprising:
    providing a substrate;
    disposing an electrical component over the substrate;
    disposing a conductive pillar over the substrate;
    depositing an encapsulant over the first electrical component and conductive pillar;
    forming a recess in the encapsulant over the conductive pillar, wherein a top surface of the conductive pillar is exposed within the recess;
    forming a first shielding layer over the electrical component and the conductive pillar, wherein the first shielding layer is completely contained within the recess;
    forming an insulating layer over the first shielding layer, wherein the insulating layer is completely contained within the recess with a top surface of the insulating layer coplanar to a top surface of the encapsulant; and
    forming a second shielding layer over the insulating layer.

11. The method of claim 10, further including forming the first shielding layer by jet printing.

12. The method of claim 11, further including forming the second shielding layer by sputtering, spraying, or plating.

13. The method of claim 10, further including singulating the substrate after forming the first shielding layer and before forming the second shielding layer.

14. A semiconductor device, comprising:
    a substrate;
    an electrical component disposed over the substrate;
    a conductive pillar disposed over the substrate;
    an encapsulant deposited over the first electrical component and conductive pillar;
    a recess formed in the encapsulant over the conductive pillar, wherein a top surface of the conductive pillar is exposed within the recess;
    a first shielding layer formed over the electrical component and the conductive pillar, wherein the first shielding layer is completely contained within the recess;
    an insulating layer formed over the first shielding layer, wherein the insulating layer is completely contained within the recess with a top surface of the insulating layer coplanar to a top surface of the encapsulant; and
    a second shielding layer formed over the insulating layer.

15. The semiconductor device of claim 14, wherein the first shielding layer is selectively formed over the electrical component and the conductive pillar.

16. The semiconductor device of claim 15, wherein the second shielding layer is a conformal shielding layer.

17. The semiconductor device of claim 14, wherein the second shielding layer extends over a side surface of the substrate.

* * * * *